United States Patent [19]

Lee

[11] Patent Number: 5,331,040
[45] Date of Patent: Jul. 19, 1994

[54] ADHESIVE COMPOSITION WITH FUNCTIONAL FILLER

[75] Inventor: Yueh-Ling Lee, Sayre, Pa.

[73] Assignee: E. I. Du Pont de Nemours and Company, Wilmington, Del.

[21] Appl. No.: 966,256

[22] Filed: Oct. 26, 1992

[51] Int. Cl.$^5$ .............................. C08L 33/00
[52] U.S. Cl. .................... 524/522; 524/501; 524/502; 524/505; 524/523; 524/371; 524/409; 526/318.4; 428/252; 428/287; 428/458
[58] Field of Search .......... 524/522, 501, 502, 505, 524/523, 409, 371; 526/318.4; 428/252, 287, 458

[56] References Cited

U.S. PATENT DOCUMENTS

| | | | |
|---|---|---|---|
| 3,032,521 | 5/1962 | Sanderson | 260/29.6 |
| 3,179,634 | 4/1965 | Edwards | 260/78 |
| 3,728,150 | 4/1973 | Yuan | 428/355 |
| 3,821,016 | 6/1974 | De Angelo | 117/47 |
| 3,822,175 | 7/1974 | Yuan | 161/93 |
| 3,891,591 | 6/1975 | Chang et al. | 260/29.6 |
| 3,900,662 | 8/1975 | Yuan et al. | 428/252 |
| 4,061,826 | 12/1977 | Petras et al. | 428/356 |
| 4,069,186 | 1/1978 | Ramig | 260/29.6 |
| 4,426,253 | 1/1984 | Kreuz et al. | 156/668 |
| 4,725,504 | 2/1988 | Knudsen | 428/458 |

FOREIGN PATENT DOCUMENTS 0429027A  5/1991  European Pat. Off. .... C09J 133/20

Primary Examiner—Paul R. Michl
Assistant Examiner—Edward Cain

[57] ABSTRACT

An adhesive composition containing a latex binder, a latex plasticizer and a functional filler. The latex plasticizer includes a copolymer comprising (1) 0–15% by weight, based upon the weight of the copolymer, of acrylonitrile, methacrylonitrile or mixtures thereof, (ii) 80–85% by weight, based upon the weight of the copolymer, of butyl acrylate, ethyl acrylate, 2-ethylhexyl acrylate, lauryl acrylate, lauryl methacrylate, octyl acrylate, heptyl acrylate, or mixtures thereof, and (iii) 1–5% by weight, based upon the weight of the copolymer, of methacrylic acid, acrylic acid, itaconic acid, or mixtures thereof, said latex plasticizer having a $T_g$ less than that of the latex binder (a) and a decomposition temperature of at least 288° C. The composition is useful for adhering polyimide films such as in the fabrication of flexible circuits.

13 Claims, No Drawings

ADHESIVE COMPOSITION WITH FUNCTIONAL FILLER

FIELD OF THE INVENTION

This invention relates to an adhesive composition with a functional filler. More particularly it relates to an adhesive composition for polyimide films and is useful in the fabrication of solderable flexible circuits.

BACKGROUND OF THE INVENTION

The flexible circuit industry requires adhesives for polyimide film and metal foils (usually copper) which can withstand elevated temperatures and a variety of harsh solvents and chemicals. During the many preparation and processing steps for circuit manufacture, these solvents and chemicals can cause an adhesive to swell leading to blister formation and/or delamination, which results in reduced circuit yields. The application of heat, such as in soldering, can similarly cause circuit failures.

U.S. Pat. Nos. 3,822,175, 3,900,662 and 3,728,150 disclose crosslinkable acrylic adhesive compositions for bonding polyimide films. Copper-polyimide laminates made using such adhesive compositions have good peel strength, are stable to soldering temperatures and are resistant to chemicals typically used in circuit manufacture.

It is sometimes desirable, however, to use adhesive compositions which have additional properties, such as flame retardancy, electrical conductivity, thermal conductivity, etc. Such special adhesive compositions are usually obtained by the addition of functional fillers to the basic composition. However, fillers tend to make the adhesive more brittle which adversely affects the peel strength of laminates made with the filled adhesive. This brittleness can be overcome somewhat by the addition of plasticizers, however these frequently are attacked by processing chemicals and generally are not stable at soldering temperatures, which can result in blister formation.

Thus, there is a need for an adhesive for polyimide film which has special functional properties without sacrificing peel strength, chemical resistance or thermal stability.

SUMMARY OF THE INVENTION

This invention relates to an adhesive composition comprising:

(a) 40–75% by weight, based upon the total amount of adhesive dry solids, of a latex comprising 1–10% by weight, based upon the latex dry components, of a crosslinking agent and 90–99% by dry weight, based upon the latex dry components, of a copolymer comprising (i) 30–50% by weight, based upon the weight of the copolymer, of acrylonitrile, methacrylonitrile or mixtures thereof, (ii) 45–70% by weight, based upon the weight of the copolymer, of butyl acrylate, ethyl acrylate, 2-ethylhexyl acrylate, lauryl acrylate, lauryl methacrylate, octyl acrylate, heptyl acrylate, or mixtures thereof, and (iii) 1–5% by weight, based upon the weight of the copolymer, of methacrylic acid, acrylic acid, itaconic acid, or mixtures thereof;

(b) 10–25% by weight, based upon the total amount of adhesive dry solids, of a latex plasticizer comprising a copolymer comprising (i) 10–15% by weight, based upon the weight of the copolymer, of acrylonitrile, methacrylonitrile or mixtures thereof, (ii) 80–85% by weight, based upon the weight of the copolymer, of butyl acrylate, ethyl acrylate, 2-ethylhexyl acrylate, lauryl acrylate, lauryl methacrylate, octyl acrylate, heptyl acrylate, or mixtures thereof, and (iii) 1–5% by weight, based upon the weight of the copolymer, of methacrylic acid, acrylic acid, itaconic acid, or mixtures thereof, said latex plasticizer having a $T_g$ less than that of the latex binder (a) and a decomposition temperature of at least 288° C.; and (c) 5–50% by weight, based upon the total amount of adhesive dry solids, of a functional filler.

In a second aspect, this invention relates to a polyimide film or a release support coated with the above adhesive coating.

In a third aspect, this invention relates to a laminate comprising at least one substrate adhered to at least one above-described adhesive coated polyimide film.

DETAILED DESCRIPTION OF THE INVENTION

The latex binder, component (a), comprises a copolymer and a crosslinking agent. The copolymer comprises three types of monomers. The first monomer is selected from the group consisting of acrylonitrile, methacrylonitrile or mixtures thereof. This component provides high temperature stability and chemical resistance to the adhesive composition. In addition, this component provides hardness to the composition so that it does not flow or creep too much. The first monomer is present in an amount of 30 to 50% by weight, based on the weight of the copolymer; preferably 30 to 40% by weight.

The second monomer is selected from the group consisting of butyl acrylate, ethyl acrylate, 2-ethylhexyl acrylate, lauryl acrylate, lauryl methacrylate, octyl acrylate, heptyl acrylate, or mixtures thereof. This component provides the flexibility and necessary softness to the adhesive composition. The second monomer is present in an amount of 45 to 70% by weight, based on the weight of the copolymer; preferably 55 to 65% by weight.

The third monomer is selected from the group consisting of methacrylic acid, acrylic acid, itaconic acid, or mixtures thereof. This component provides the functionality for crosslinking the adhesive composition. The third monomer is present in an amount of about 1 to 5% by weight, based on the weight of the copolymer; preferably about 5% by weight.

The copolymer is present in an amount of about 90 to 99% by weight, based on the latex dry solids; preferably about 95% by weight.

A crosslinking agent is added to the copolymer to increase the stability of the adhesive composition after it is applied to a substrate. Examples of crosslinking agents are well known and include formaldehyde resins, novolak resins and epoxy resins. The crosslinking agent is usually present in an amount of about 1 to 10% by weight, based on the latex dry solids.

A preferred latex binder is a copolymer of acrylonitrile(AN)/butyl acrylate(BA)/methacrylic acid(MAA) in an approximate 35/60/5 ratio by weight, mixed with 5% by dry weight phenol formaldehyde resin as crosslinking agent. The latex binder is present in an amount of 40 to 75% by weight, based on the total amount of adhesive dry solids.

The latex plasticizer, component (b), is present in the adhesive composition to overcome the adverse effects of the addition of the functional filler, component (c).

The plasticizer should have good chemical resistance, thermal stability, softness and toughness. In general, this means that the plasticizer must have a glass transition temperature ($T_g$) less than that of the latex binder and at the same time have a decomposition temperature greater than soldering temperatures, i.e., 288° C. The decomposition temperature is defined as the lowest temperature at which there is a 5% weight loss as measured by thermogravimetric analysis (TGA). It is also preferred that the plasticizer be compatible with the latex binder.

It has been found that all of these criteria are satisfied by using a latex copolymer where the copolymer is of the same types of monomers as in the latex binder copolymer. This combination of monomers provides a copolymer having the chemical resistance and thermal stability necessary. By increasing the proportion of the softer monomer, i.e., the second monomer (ii), the $T_g$ of the copolymer is lowered so that it also provides a plasticizing effect.

The first monomer of the plasticizer copolymer is selected from the group consisting of acrylonitrile, methacrylonitrile or mixtures thereof, but is present in an amount of 10 to 15% by weight, based on the weight of the copolymer. The lower (meth) acrylonitrile content lowers the $T_g$ of the copolymer resulting in a plasticizing effect.

The second monomer in the plasticizer copolymer is selected from the group consisting of butyl acrylate, ethyl acrylate, 2-ethylhexyl acrylate, lauryl acrylate, lauryl methacrylate, octyl acrylate, heptyl acrylate, or mixtures thereof. The second monomer is present in an amount of 80 to 85% by weight, based on the weight of the copolymer.

The third monomer in the plasticizer copolymer is selected from the group consisting of methacrylic acid, acrylic acid, itaconic acid, or mixtures thereof. The third monomer is present in an amount of about 1 to 5% by weight, based on the weight of the copolymer; preferably about 5% by weight.

The functional filler, component (c), is added to achieve special properties in the adhesive composition. Types of functional fillers which can be used include flame retardants, electrical conductors, thermally conductive materials, mechanical reinforcing agents, pigments, and the like. The amount of functional filler present in the adhesive composition depends very strongly on the nature of the filler. In general, the filler is present in an amount from about 5 to 50% by weight, based on the adhesive dry solids.

Of particular interest as a functional filler are flame retardants. Preferred flame retardants are halogenated organic compounds having a halogen content greater than 65%. In order not to affect the thermal stability of the adhesive composition, the flame retardant compounds should have a decomposition temperature of at least 288° C., as measured by TGA.

The most preferred flame retardants are brominated compounds. Examples of preferred flame retardants include decabromodiphenyl oxide, bis(tribromophenoxy) ethane, poly(pentabromobenzyl acrylate), ethylene bistetrabromophthalimide and mixtures thereof.

In order to achieve adequate flame retardancy, it is sometimes necessary to add an amount of antimony oxide which is known to be a synergistic flame retardant when added to brominated compounds. Any of the antimony oxides can be used, preferably as a colloidal dispersion. The dispersion of antimony oxide should also have a decomposition temperature, after water removal, of at least 288° C. The decomposition temperature generally is a reflection of the types of dispersants used in commercial antimony oxide dispersions.

The amount of flame retardant plus antimony oxide, when present, in the adhesive composition should be about 30 to 45% by weight, based on the adhesive dry solids. The ratio of flame retardant to antimony oxide, when present, should be in the range of 2 to 5.

Examples of other functional fillers which can be used in the adhesive composition include electrical conductors such as carbon black and conductive metals; thermally conductive materials such as alumina; mechanical reinforcing agents such as fumed silica or fibers of fiberglass, boron, polyester, polyamide, acrylic, aramid, etc.; and color pigments. Such functional fillers are generally present in the adhesive composition in an amount of up to about 50% by weight, based on the adhesive dry solids.

In general, the functional filler should have an average particle size of about 1 to 10 micrometers.

The functional filler can be added to the adhesive composition in the form of a solid which is then dispersed in the composition, a pre-made aqueous dispersion, or as an aqueous-based latex. The exact form which is used will depend on the nature of the filler. Although not preferred, the filler can be added as a dispersion or solution in a suitable organic liquid or mixtures of organic liquids, as described in U.S. Pat. No. 3,900,662, as long as the liquid is compatible with the latex components (a) and (b).

The adhesive composition can also contain small amounts of other materials to improve the shelf life of the adhesive, such as dispersants, coalescence aids, coating aids, and the like. All such components should not deleteriously affect the chemical resistance and thermal stability of the adhesive composition, nor should they lower the peel strength.

The adhesive compositions of the invention can be stored as a latex or dispersion in water. Although not preferred, the adhesive can be contained as a dispersion or solution in a suitable organic liquid or mixtures of organic liquids. Examples of suitable organic liquids are disclosed in U.S. Pat. No. 3,032,521. Alternatively, the adhesive can be coated on either a release substrate or polyimide film and stored as a roll.

By "polyimide film" is meant a layer of polyimide or polyimide that contains reinforcing material. Polyimides suitable for use in practicing the invention are disclosed in U.S. Pat. No. 3,179,634. Reinforcing materials which can be used include those enumerated as being suitable for the adhesive composition. The thickness of the polyimide film will depend on the final application, however, it is generally from about 0.5 to 5.0 mils thick. It is sometimes desirable to treat the surface of the polyimide film to improve its adhesion. Suitable surface treatments have been described in U.S. Pat. Nos. 3,821,016, 4,426,253 and 4,725,504.

The adhesive composition can be prepared in an unsupported form by application to a release substrate such as coated paper or polyester. It can then be stored in roll form. Alternatively, the adhesive composition can be coated directly onto one or both sides of a non-release substrate, especially polyimide film. The adhesive composition can be applied by conventional application procedures such as spraying, printing, brushing, dip coating, roll coating, and the like. The adhesive can be applied in varying thicknesses depending on the desired end use. Greater thicknesses can be achieved by a plurality of coats. Ordinarily, the acrylic adhesive will have a thickness of at least 0.1 mil and should not exceed about 20 mils. A preferred thickness is 0.1 to 10 mils with 0.5 to 3 mils being especially preferred.

The adhesive coated polyimide films of the invention can be adhered to suitable substrates to form laminates. Suitable substrates include metal and especially metal foils of copper, aluminum, nickel, silver, gold, iron or their alloys; woven and non-woven fabrics made from natural or synthetic fibers such as glass, boron, polyester, polyamide, acrylic, etc.; woven and non-woven fabric impregnated with resin such as polyimide, polyamide, epoxy, acrylic; paper of natural or synthetic fibers such as aramid paper; and films of polymers such as polyimide, polyamide, polyester, acrylic, epoxy polyurethane, etc. Preferred substrates include metal, polyimide film, aramid paper, woven and nonwoven glass fabric, and polyimide or epoxy impregnated glass fabric. Particularly preferred is copper foil.

Various techniques can be used to join material surfaces using the adhesive compositions of the invention. For example, when the adhesive has been applied as a film to a release support such as polyester film or polymer coated paper, two materials can be joined by applying the exposed layer of the adhesive films to one of the materials, peeling off the substrate support from the adhesive film, thus exposing a second surface of the adhesive, and then laminating the second layer of material to the exposed surface of the adhesive film under pressure and heat sufficient to effect crosslinking of the crosslinking agent in the adhesive film.

On the other hand, when the adhesive composition is applied to a nonrelease support, e.g., a polyimide film, the polyimide film can be joined to a second material such as a printed circuit board or metal foil by laminating the polyimide-coated adhesive film to the second material under heat and pressure sufficient to initiate and effect complete crosslinking of the crosslinking agent.

Standard lamination procedures can be used to make the laminates. These include vacuum bag lamination, press lamination, roll lamination, etc. In each case, the laminates are cured, usually under pressure, and typically for 60 minutes at 180° C. to suitably crosslink the adhesive.

EXAMPLES

Test Procedures

1. Peel Strength: Test IPC-TM-650, method 2.4.9. Revision A or B.
2. Flame Test: Underwriters Test 94 VTM-O This test was run on five samples. In order to pass, the samples must have:
   a. no specimens which burn with flaming combustion for more than 10 seconds after each application of the flame;
   b. a total flaming combustion time no greater than 50 seconds for the 10 flame applications for each set of 5 specimens;
   c. no specimens which burn with flaming or glowing combustion up to the 5-inch mark;
   d. no specimens which drip flaming particles that ignite the dry absorbent surgical cotton located 12 inches below; and
   e. no specimens with glowing combustion which persists beyond 30 seconds after the second removal of the test flame.

3. Solder Float Test: IPC-TM-650 method 2.4.13, with copper on both sides.

A sample of double-sided copper clad, i.e., copper-adhesive-polyimide-adhesive-copper, was floated on the surface of Sn/Pb solder at a temperature of 550° F. (288° C.). The surface was observed for blisters or delaminations. "Pass" designates samples which showed no visible defects after 10 seconds of exposure. "Fail" designates samples which had defects before 10 seconds of exposure to the solder.

Materials

| | |
|---|---|
| FR-1 | Decabromodiphenyl oxide; Great Lakes DE-83 TM, Great Lakes Chemical Corp. (West Lafayette, IN) |
| FR-2 | Hexabromocyclododecane; Great Lakes CD-75P TM, Great Lakes Chemical Corp. (West Lafayette, IN) |
| FR-3 | Bis(tribromophenoxy) ethane; Great Lakes FF-680 TM, Great Lakes Chemical Corp. (West Lafayette, IN) |
| FR-4 | Poly(pentabromobenzyl acrylate); FR-1025 ®, Ameribrom Corp. (New York, NY) |
| FR-5 | Ethylene bis(tetrabromophthalimide); Saytex BT-93 ®, Ethyl Corp. (Baton Rouge, LA) |
| FR-6 | Poly(dibromophenylene oxide); Great Lakes PO-64P TM, Great Lakes Chemical Corp. (West Lafayette, IN) |
| FR-7 | Poly(dibromostyrene), % Br = 59; Great Lakes PDBS-80 TM, Great Lakes Chemical Corp. (West Lafayette, IN) |
| FR-8 | Poly(dibromostyrene), % Br = 59; Great Lakes PDBS-10 TM, Great Lakes Chemical Corp. (West Lafayette, IN) |
| $Sb_2O_3$ | Aqueous dispersion of $Sb_2O_3$; Amsperse F/R 291-50, Amspec, Inc., (Gloucester City, NJ) |

EXAMPLE 1

This examples illustrates the peel strength obtained when using the latex platicizer of the invention in preparing a flame retardant adhesive composition.

The latex binders were prepared as described in U.S. Pat. No. 3,822,175, using the following copolymers:

| Binder | Weight % | | |
|---|---|---|---|
| | AN | BA | MAA |
| B-1 | 35 | 60 | 5 |
| B-2 | 31 | 64 | 5 |
| B-3 | 25 | 70 | 5 |

For all the latex binders the crosslinking agent was a phenol formaldehyde resin (Ucar ® BRL-1100, made by Union Carbide, Danbury, Conn.), at a level of 5.0% by weight, based on the adhesive dry solids.

The latex plasticizer, P-1, was prepared using the same procedure that was used to prepare the latex binder, but without any crosslinking agent. The copolymer composition was 15% AN, 80% BA and 5% MAA, by weight.

The adhesive compositions were prepared by mixing the ingredients listed below:

| Sample | B-1 | B-2 | B-3 | P-1 | FR-4 |
|---|---|---|---|---|---|
| 1-A | 60 | — | — | — | 40 |
| 1-B | — | 60 | — | — | 40 |
| 1-C | — | — | 60 | — | 40 |

-continued

| Sample | B-1 | B-2 | B-3 | P-1 | FR-4 |
| --- | --- | --- | --- | --- | --- |
| 1-D | 45 | — | — | 15 | 40 |
| 1-E | — | 45 | — | 15 | 40 |

Both the latex binder and the latex plasticizer (when present) were added as an aqueous latex with approximately 48% solids.

For each sample, the mixture was ball milled in a mill jar for about 16 hours. The dispersion was then filtered through 400 mesh screen. Doctor knife coatings were made directly from this dispersion onto 1 mil (0.0025 cm) thick Kapton ® HN polyimide film (E. I. du Pont de Nemours & Co., Wilmington, Del.) with a 5 mil (0.013 cm) doctor knife, dried in a 100° C. forced draft oven to an adhesive thickness of 1.2 mils (0.0030 cm). Laminates were made by placing the adhesive coated side of the Kapton ® film next to the treated side of 1 ounce/ft² (0.061 g/cm²) roll annealed copper and laminating at 360° F (182° C.) for 1 hour at 200 psi (35.7 kg/m²). The peel strength for the laminates was measured and is given below.

| | Peel Strength | |
| --- | --- | --- |
| Sample | pli | N/mm |
| 1-A | 3.2–4.6 | 0.5–0.8 |
| 1-B | 5.6–6.0 | 0.95–1.0 |
| 1-C | 6.4–6.8 | 1.1–1.2 |
| 1-D | 7.1–7.4 | 1.2–1.3 |
| 1-E | 7.2–7.8 | 1.2–1.3 |

EXAMPLE 2

This example illustrates the flame retardant properties of adhesive compositions of the invention using the preferred flame retardant fillers.

Adhesive compositions were made according to the procedure given in Example 1, using 35% latex binder B-1, 15% plasticizer P-1, 20% organic flame retardant filler and 10% Sb₂O₃ filler, where the percents are by weight based on adhesive dry solids. Laminates were made using these adhesives according to the procedure given in Example 1.

The flame retardants, their decomposition temperatures, and laminate test results are given below.

| Sample | Filler | Temp | % Br | Peel | Flame | Solder |
| --- | --- | --- | --- | --- | --- | --- |
| 2-A | FR-1 | 357 | 83 | 14–18 | Pass | Pass |
| 2-B | FR-2 | 265 | 75 | 10–12 | Pass | Fail |
| 2-C | FR-3 | 290 | 70 | 10–14 | Pass | Pass |
| 2-D | FR-4 | 360 | 70 | 10–12 | Pass | Pass |
| 2-E | FR-5 | 450 | 67 | 10–12 | Pass | Pass |
| 2-F | FR-6 | 400 | 64 | 10–12 | Fail | Pass |
| 2-G | FR-7 | 381 | 59 | 10–12 | Fail | Pass |
| 2-H | FR-8 | 355 | 59 | 10–12 | Fail | Pass |

Temp = decomposition temperature with 5% weight loss as measured by TGA
Peel = peel strength in pli (0.017 N/mm)
Flame = flame test as described above
Solder = solder float test as described above The data show that only those organic flame retardant fillers which have a decomposition temperature greater than 288° C. and a bromine content greater than about 65% (Samples 2-A and 2-C through 2-E) meet the stringent requirements of the flame and solder tests described above. When the decomposition temperature of the flame retardant filler is less than 288° C. (Sample 1-B), the laminate does not pass the solder float test but is acceptable for applications not involving soldering. When the bromine content is less than about 65% (Samples 2-F through 2-H), the laminate does not pass the flame test but is still acceptable in applications requiring lower levels of flame retardancy.

EXAMPLE 3

This example illustrates the use of different kinds of functional fillers in the adhesive compositions of the invention.

Adhesive compositions are made according to the procedure given in Example 1 using the materials given in the table below. Laminates are made using these adhesives according to the procedure given in Example 1.

| | Weight % | | | | |
| --- | --- | --- | --- | --- | --- |
| Component | 3-A | 3-B | 3-C | 3-D | 3-E |
| B-1 | 55 | 50 | 40 | 40 | 75 |
| P-1 | 15 | 15 | 10 | 20 | 20 |
| Copper powder | 30 | — | — | — | — |
| Silver flake | — | 30 | — | — | — |
| Carbon black | — | 5 | — | — | 5 |
| Alumina | — | — | 50 | — | — |
| Glass fiber | — | — | — | 40 | — |

Weight % is based on adhesive dry solids
B-1 = latex binder
P-1 = plasticizer

Samples 3-A and 3-B illustrative adhesives that are electrically conductive. Samples 3-C illustrates an adhesive that is thermally conductive. Sample 3-D illustrates an adhesive filled with a mechanical reinforcing agent. Sample 3-E illustrates a pigmented adhesive.

What is claimed is:

1. An adhesive composition comprising:
   (a) 40–75% by weight, based upon the total amount of adhesive dry solids, of a latex comprising 1–10% by weight, based upon the latex dry components, of a crosslinking agent and 90–99% by dry weight, based upon the latex dry components, of a copolymer comprising (i) 30–50% by weight, based upon the weight of the copolymer, of acrylonitrile, methacrylonitrile or mixtures thereof, (ii) 45–70% by weight, based upon the weight of the copolymer, of butyl acrylate, ethyl acrylate, 2-ethylhexyl acrylate, lauryl acrylate, lauryl methacrylate, octyl acrylate, heptyl acrylate, or mixtures thereof, and (iii) 1–5% by weight, based upon the weight of the copolymer, of methacrylic acid, acrylic acid, itaconic acid, or mixtures thereof;
   (b) 10–25% by weight, based upon the total amount of adhesive dry solids, of a latex plasticizer comprising a copolymer comprising (i) 10–15% by weight, based upon the weight of the copolymer, of acrylonitrile, methacrylonitrile or mixtures thereof, (ii) 80–85% by weight, based upon the weight of the copolymer, of butyl acrylate, ethyl acrylate, 2-ethylhexyl acrylate, lauryl acrylate, lauryl methacrylate, octyl acrylate, heptyl acrylate, or mixtures thereof, and (iii) 1–5% by weight, based upon the weight of the copolymer, of methacrylic acid, acrylic acid, itaconic acid, or mixtures thereof, said latex plasticizer having a $T_g$ less than that of the latex binder (a) and a decomposition temperature of at least 288° C.; and
   (c) 5–50% by weight, based upon the total amount of adhesive dry solids, of a functional filler.

2. The adhesive composition of claim 1 wherein the functional filler is selected from the group consisting of flame retardants, thermally conductive materials, electrically conductive materials, mechanical reinforcing agents, pigments, and mixtures thereof.

3. The adhesive composition of claim 1 wherein the functional filler is a flame retardant and is present in an amount of 30–45% by weight, based upon the total amount of adehsive dry solids.

4. The adhesive composition of claim 3 wherein the functional filler comprises:
   (cl) 20–30% by weight, based upon the total amount of adhesive dry solids, of a brominated organic compound having a bromine content greater than 65% by weight, and having a decomposition temperature of at least 288° C., and
   (c2) 10–15% by weight, based upon the total amount of adhesive dry solids, of an antimony oxide, said antimony oxide being added in the form of an aqueous dispersion, said dispersion having a decomposition temperature, after water removal, of at least 288° C.

5. The adhesive composition of claim 4 wherein the halogenated organic compound is selected from the group consisting of decabromodiphenyl oxide, bis(tribromophenoxy)ethane, poly(pentabromobenzyl acrylate), ethylene bis-tetrabromophthalimide and mixtures thereof.

6. The adhesive composition of claim 4 wherein the copolymer in the latex binder (a) comprises 35% by weight acrylonitrile, 60% by weight butyl acrylate and 5% by weight methacrylic acid, based on the weight of the copolymer.

7. The adhesive composition of claim 4 wherein the copolymer in the latex plasticizer (b) comprises 15% by weight acrylonitrile, 80% by weight butyl acrylate and 5% by weight methacrylic acid, based on the weight of the copolymer.

8. A laminate comprising a layer of the adhesive composition of claim 1 adhered to a substrate.

9. The laminate of claim 8 wherein the substrate comprises a release layer comprising polyester or paper coated with a release agent.

10. The laminate of claim 8 wherein the substrate is selected from the group consisting of metal foil, polyimide film, polyaramid paper, woven glass fabric, nonwoven glass fabric, polyimide impregnated glass fabric and epoxy impregnated glass fabric.

11. The laminate of claim 10 wherein the substrate is polyimide film, said polyimide film having adhered thereto on both sides a layer of the adhesive composition of claim 1.

12. A laminate comprising a polyimide film adhered to a layer of the adhesive composition of claim 1 adhered to a metal foil.

13. A laminate comprising a polyimide film adhered to a layer of the adhesive composition of claim 4 adhered to a metal foil.

* * * * *